(12) United States Patent
Barnett et al.

(10) Patent No.: US 6,541,800 B2
(45) Date of Patent: Apr. 1, 2003

(54) HIGH POWER LED

(75) Inventors: Thomas J. Barnett, Columbus, OH (US); Sean P. Tillinghast, Bexley, OH (US)

(73) Assignee: Weldon Technologies, Inc., Columbus, OH (US)

( * ) Notice: Subject to any disclaimer, the term of this patent is extended or adjusted under 35 U.S.C. 154(b) by 0 days.

(21) Appl. No.: 10/073,731

(22) Filed: Feb. 11, 2002

(65) Prior Publication Data

US 2002/0113244 A1 Aug. 22, 2002

Related U.S. Application Data

(60) Provisional application No. 60/270,572, filed on Feb. 22, 2001.

(51) Int. Cl.$^7$ .......................... H01L 27/15; H01L 31/12
(52) U.S. Cl. .......................... 257/98; 257/99; 257/100
(58) Field of Search ..................... 257/98–100

(56) References Cited

U.S. PATENT DOCUMENTS

| | | | | |
|---|---|---|---|---|
| 3,899,826 A | * | 8/1975 | Russ ........................... | 257/92 |
| 4,478,588 A | | 10/1984 | Lockard ....................... | 445/22 |
| 4,727,283 A | | 2/1988 | van Kemenade et al. ... | 313/487 |
| 4,882,617 A | | 11/1989 | Vriens ........................ | 358/60 |
| 5,440,658 A | * | 8/1995 | Savage, Jr. .................. | 385/79 |
| 5,514,627 A | | 5/1996 | Lowery et al. ............. | 437/209 |
| 5,557,115 A | | 9/1996 | Shakuda ...................... | 257/81 |
| 5,578,839 A | | 11/1996 | Nakamura et al. ........... | 257/96 |
| 5,606,182 A | | 2/1997 | Yoshida et al. .............. | 257/99 |
| 5,648,687 A | | 7/1997 | Matsuo et al. .............. | 257/787 |
| 5,652,434 A | | 7/1997 | Nakamura et al. ........... | 257/13 |
| 5,798,537 A | | 8/1998 | Nitta .......................... | 257/103 |
| 5,813,752 A | | 9/1998 | Singer et al. .............. | 362/293 |
| 5,813,753 A | | 9/1998 | Vriens et al. .............. | 362/293 |
| 5,847,507 A | | 12/1998 | Butterworth et al. ....... | 313/512 |
| 5,910,661 A | | 6/1999 | Colvin, Jr. ................. | 250/573 |

(List continued on next page.)

FOREIGN PATENT DOCUMENTS

JP         05011714 A    *   1/1993            G09F/9/33

OTHER PUBLICATIONS

EP 1 059 667 A (Sanyon Electric Co) Dec. 13, 2000.
Patent Abstracts of Japan vol. 2000, No. 19 Jun. 5, 2001 & JP 2001 036143 A (Stanley Electric Co. Ltd), Feb. 9, 2001.
GB 2 343 549 A (Hewlett Packard Co) May 10, 2000.
EP 0 854 523 A (Tokyo Shibaura Electric Co) Jul. 22, 1998.
Patent Abstracts of Japan vol. 1997, No. 04, Apr. 30, 1997 & JP 08 335719 A (Nichia Chem Ind Ltd), Dec. 17, 1996.

*Primary Examiner*—Allan R. Wilson
(74) *Attorney, Agent, or Firm*—James R. Eley; Thompson Hine LLP (57) ABSTRACT

A method and system are taught for a system comprising an LED package. The LED package may comprise an anode, a cathode coupled to the anode, an LED die coupled to the cathode and the anode, a lens coupled to the anode, and a viscous or silicone material located in a cavity defined by the lens, the cathode, and the anode. The viscous or silicone material may be a gel, a grease, a non-resilient material, or a non-liquid material. The method and system may further comprise a mounting device, wherein the lens is mechanically coupled to the mounting device in a socket, bayonet, or screwing like fashion. The method and system may further comprise an anode strip comprising an array of anodes utilized to form an array of the LED packages and a carrier strip comprising receiving devices to receive the array of LED packages. A portion of the lens may either be coated with or comprise light excitable material or the viscous material may comprise light excitable material, such that the system emits white light.

38 Claims, 12 Drawing Sheets

U.S. PATENT DOCUMENTS

| | | | |
|---|---|---|---|
| 5,998,925 A | 12/1999 | Shimizu et al. | 313/503 |
| 6,051,849 A | 4/2000 | Davis et al. | 257/103 |
| 6,066,861 A * | 5/2000 | Hohn et al. | 252/301.36 |
| 6,084,252 A | 7/2000 | Isokawa et al. | 257/98 |
| 6,158,882 A | 12/2000 | Bischoff, Jr. | 362/488 |
| 6,163,038 A | 12/2000 | Chen et al. | 257/103 |
| 6,204,523 B1 | 3/2001 | Carey et al. | 257/98 |
| 6,252,254 B1 * | 6/2001 | Soules et al. | 257/100 |
| 6,274,924 B1 | 8/2001 | Carey et al. | 257/676 |
| 6,302,595 B1 * | 10/2001 | Vilgiate et al. | 385/88 |

* cited by examiner

HIGH POWER LED

RELATED APPLICATIONS

This application claims priority under 35 U.S.C. § 119(e) as being based on U.S. Provisional Patent Application No. 60/270,572 filed Feb. 22, 2001 entitled "High Power LED Package."

FIELD

The embodiments relate generally to packaging for use in manufacturing light emitting diodes (LED), and the like, that may provide greater light output and increased reliability. One aspect of the embodiments may be to produce an optically efficient LED that can generate a higher degree of illumination per unit area than is currently available in the art. Another aspect of the embodiments may be to provide a means of mechanically attaching the device to a light fixture or printed circuit board. Another aspect of the embodiments may be to provide an improved package for LEDs and a method for packaging multiple LEDs on strips, which better facilitates automated manufacturing methods for assemblies utilizing the LEDs. Another aspect of the embodiments may be to provide a means of producing a white light. Another aspect of the embodiments may be to provide a means of mounting multiple LED dice.

PRIOR ART

The art of manufacturing the light emitting component of LEDs is widely described in the art and well known to those so skilled. Furthermore, the art of producing white LEDs is well known and described in the art. Pertinent patents include: U.S. Pat. No. 5,813,752 issued to Singer et al. on Sep. 29, 1998, entitled "UV/Blue LED-Phosphorus Device With Short Wave Pass, Long Wave Pass Band Pass and Peroit Filters," which describes the use of a layered blue/UV LED semiconductor having a top layer of phosphor and filters for producing white light; U.S. Pat. Nos. 5,998,928 and 6,060,440 issued to Shimizu et al. on Dec. 7, 1999 and May 20, 2000, respectively and each entitled "Light Emitting Device Having A Nitride Compound Semiconductor And A Phosphor Containing A Garnet Fluorescent Material," which describe the design of white LEDs that utilize blue LEDs to excite a layer of phosphor material comprising garnet fluorescent materials activated with cerium and/or including the use of dispersing materials surrounding the phosphor containing components to diffuse the resulting illumination.

The structural makeup of various LED packages are also disclosed in the commercial data sheets of a number of LED manufacturers, see for example, the technical data sheets for Super Flux LEDs, by LumiLeds (a joint venture between Philips Lighting and Agilent Technology); SnapLED 150 LEDs, by LumiLeds; Six LED High Mount Stop Light Array, by LumiLeds; Luxeon Star, by LumiLeds; Shark Series, High Flux LED Illuminators, by Opto Technology, Inc.

BACKGROUND

A light emitting diode (LED) is a compact semiconductor device that generates light of various colors when a current is passed through it. The color depends primarily upon the chemical composition of the light emitting component, or chip, of the LED die. LEDs exhibit various advantages over filament based lighting devices such as longer life, lower power requirements, good initial drive characteristics, high resistance to vibration and high tolerance to repeated power switching. Because of these favorable characteristics LEDs are widely used in such applications as indicators and lower power lighting applications.

Recently LEDs for red, green and blue (RGB) having high luminance and efficiencies have been developed and employed in large screen LED displays. This type of LED display can be operated with less power and has favorable characteristics as being lightweight and exhibiting long life. The application for use of LEDs as alternative light sources is burgeoning.

Even in light of its positive characteristics, since the device is not 100% efficient at generating light from the supplied electrical current, a great deal of heat can be produced by the LED chip. Therefore, heat sinks are employed to dissipate heat generated by the LED, usually provided through the metal lead frame of the LED itself. If the heat is not adequately dissipated, stress is imposed on various internal components of the LED due to differing coefficients of thermal expansion. Some manufacturers have produced more powerful LEDs having large heat sinks but at a trade-off. First, if a LED with a large heat sink is soldered using conventional methods (i.e. wave solder, reflow solder), the heat from the soldering process is transferred to the LED chip, which may cause failure of the LED. Second, if the LED is soldered using non-conventional techniques (i.e. bar soldering or laser soldering), this must generally be performed by the LED manufacturer due to the heat sensitive nature of the process. Therefore, the LED manufacturer provides a high flux LED as a "board level" component. Unfortunately, such a configuration may not accommodate the physical space requirements of the intended end product design.

In addition, optical coupling of the LED to an associated lens is inefficient. Generally, an LED consists of a semiconductor chip potted into place on a substrate using an optically clear epoxy. This direct interface of the chip (index of refraction $n \approx 3.40$) to the epoxy ($n \approx 1.56$) creates a dramatic index of refraction gradient between the two materials. As light travels from a medium of high index of refraction to low index of refraction, Fresnel losses are experienced due to the inability of the light to escape the package caused by internal reflection. Therefore, a material or a layer of material that minimizes the transition in index of refraction will decrease the Fresnel losses that would otherwise occur. By substituting the clear epoxy with one or more layers of an optical gel or fluid (hereinafter, collectively referred to as a "gel") having an index of refraction value midway between the LED chip material and the epoxy, photon extraction, and thus light output, will be enhanced.

Furthermore, because the epoxy used to encapsulate the conventional LED chip is generally rigid when fully cured, thermal expansion can cause a degree of shear and tensile stress on the bond(s) between the wire and LED chip. By encapsulating the chip and wire bond in a gel instead of an epoxy, the wire bonds are enabled some movement within the gel under normal operating conditions, thereby lessening the shear and stresses between the chip and the wire bonding.

Finally, when incorporated into various product applications, LEDs (in their numerous package designs) are generally designed to be assembled onto a printed circuit board and secured using a soldering process. However, since the LED package of the present invention can be assembled using an alternative mechanical process (i.e., pin & socket, laser-welding, etc.), the use of LEDs is more flexible for automated manufacturing processes, utilizes less board space than previously required and can accommodate a wider variety of product applications. Mechanical attachment of the LED package of the present embodiments will greatly reduce or even eliminate altogether the heat to which the LED chip is exposed during the LED assembly process, thereby eliminating a major source of component failure. In addition, the LED is provided with an integral metal lead frame providing substantial greater heat sinking than that provided by conventional LEDs coupled to an epoxy printed circuit board.

SUMMARY

One embodiment provides a system comprising an LED package. The LED package comprises an annular anode and a cathode coupled to the annular anode. The LED package also comprises an LED die coupled to the cathode and the annular anode and a lens coupled to the annular anode. The LED package also comprises a viscous material located in a cavity defined by the lens, the cathode, and the annular anode.

Another embodiment provides a system comprising a mounting device and an LED package. The LED package comprises an annular lead frame with a central opening, a heat sink coupled to the lead frame adjacent the central opening, an LED die coupled to the heat sink and via wire bonding to the lead frame, and a lens coupled to the lead frame. The lens comprises protrusions that are utilized to mechanically secure the LED package to the mounting device. The LED package further comprises silicone material located in a cavity defined by the lens, the heat sink, and the lead frame.

Another embodiment provides a method for making a system with an LED package. The making of the LED package comprising the steps of a) providing a heat sink with a die cup, b) providing an annular lead frame with a concentric opening that receives the heat sink, c) coupling an LED die to the die cup of the heat sink, d) coupling the LED die, via wire bonding, to the lead frame through the concentric opening, e) dispensing a viscous material into a cavity defined by the lens, the lead frame, and the heat sink, and f) coupling a lens to the lead frame.

Another embodiment provides a system comprising an LED package. The LED package comprises an annular anode and a cathode coupled to the annular anode The LED package also comprises an LED die coupled to the cathode and the annular anode and a lens coupled to the annular anode. The LED package also comprises a cavity defined by the lens, the cathode, and the annular anode.

Another embodiment provides a system comprising an LED package. The LED package comprises an anode and a cathode coupled to the anode. The LED package also comprises an LED die coupled to the cathode and the anode and a lens coupled to the anode. The LED package also comprises a viscous material located in a cavity defined by the lens, the cathode, and the anode.

Another aspect may be that the viscous or silicone material is a gel, a grease, a non-resilient material, or a non-liquid material.

Another aspect may be that the system comprises a mounting device, where the LED package is mechanically coupled to the mounting device via the lens.

Another aspect may be that the system further comprises an anode strip comprising an array of anodes utilized to form an array of the LED packages and a carrier strip comprising receiving devices to receive the array of LED packages.

Another aspect may be that a portion of the lens is either coated with or comprises light excitable material such that the system emits white light. Another aspect may be that the silicone or viscous material includes light excitable material such that the system emits white light.

Another aspect may be that a plurality of LED dies are used.

BRIEF DESCRIPTION OF THE DRAWINGS

Further features of the present invention will become apparent to those skilled in the art to which the present embodiments relate from reading the following specification and claims, with reference to the accompanying drawings, in which:

DESCRIPTION OF THE PREFERRED EMBODIMENT

With reference to FIGS. 1–4, an LED package 10 of a system 100 is shown. The LED package 10 of the system 100 comprises an annular anode 12, a cathode, 14, an LED die 16, and a lens 18. Also, a silicone or viscous material 20 may be located in a cavity 22 defined by the annular anode 12, the cathode 14, and the lens 18. This viscous material 20 may be a clear silicone gel or grease, a non-resilient material, a non-liquid material, or the like. In other embodiments, the cavity 22 may contain a liquid, resilient or solid material or may not contain any material.

Figure 9A:
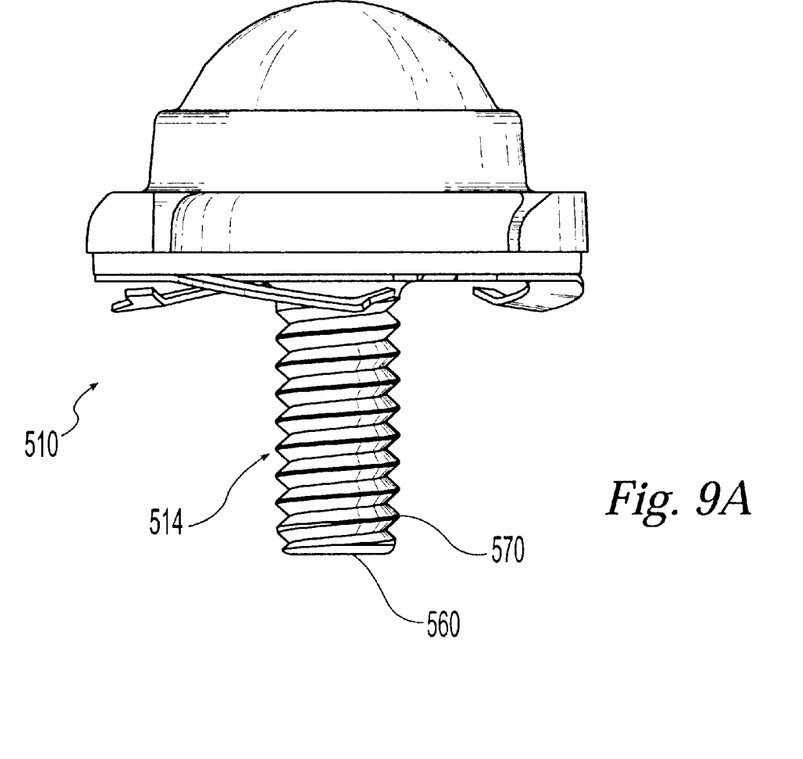
FIG. 9A is a side view of another embodiment of an LED package.
Figure 9B:
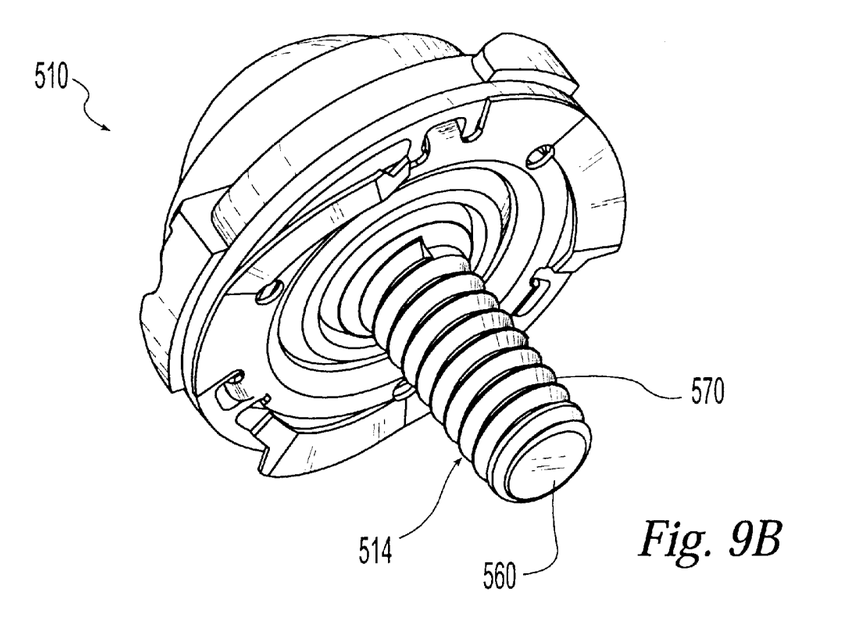
FIG. 9B is a bottom view of the LED package of FIG. 9A.
Figure 10:
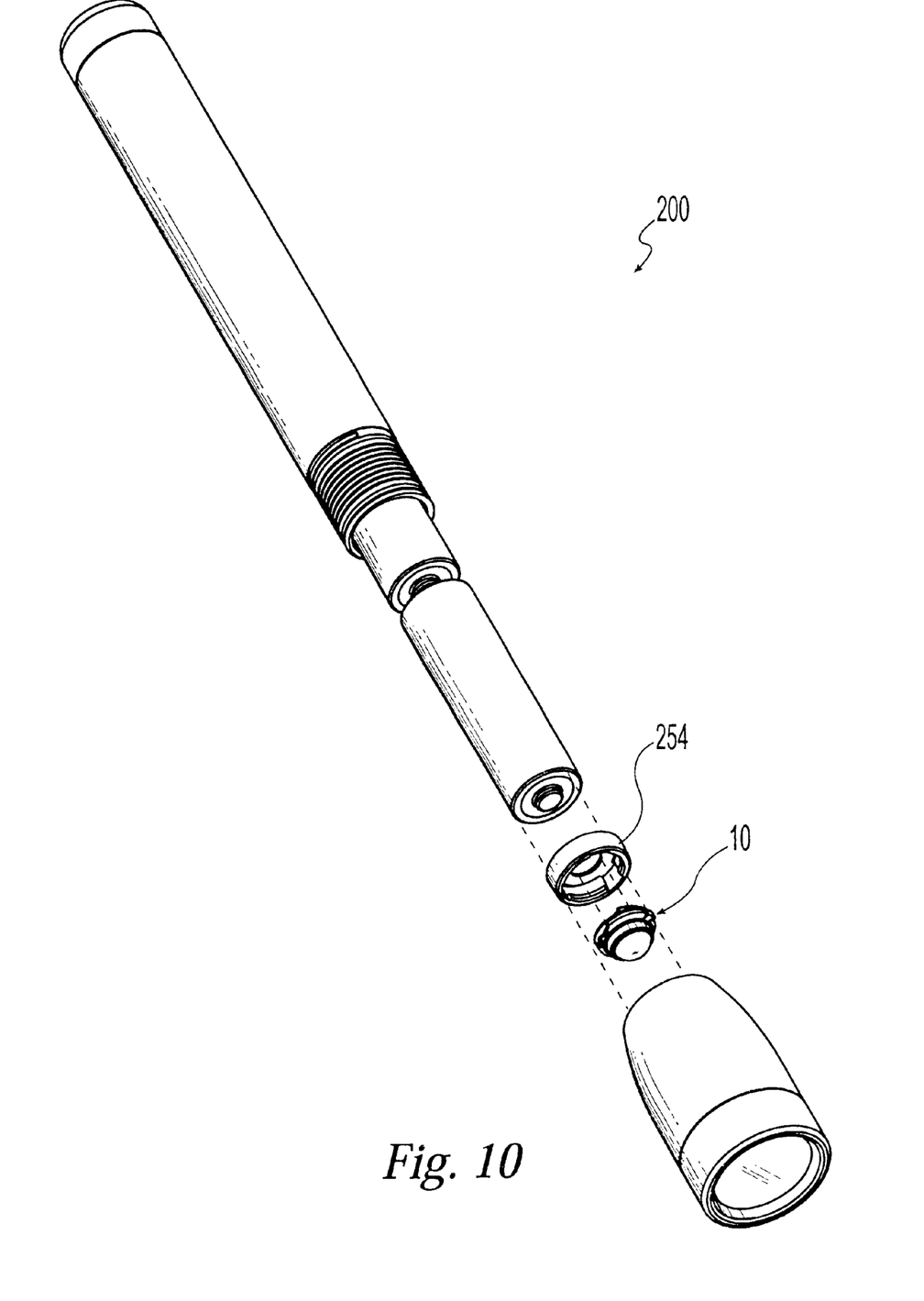
FIG. 10 is an illustration of another embodiment of the system comprising a casing and an LED package.

The LED die 16 is coupled to a die cup 24 of the cathode 14 and to the anode 12 via wire bonding 26. The LED die 16 may be coupled by a thermally and electrically conductive epoxy or the like to the die cup 24. The die cup 24 may have reflective surfaces. The cathode 14 is coupled to the anode 12 through use of a coupling material 28, which may be liquid crystal polymer, or the like, so long as the material is thermally conductive and electrically insulating. After dispensing the viscous material 20 into the cavity 22, the lens 18 is coupled to the anode 12 via complementary coupling devices 30 (see FIG. 3), which may be barbs or anode retention tabs, and coupling devices 31 (see FIG. 3), which may be receiving openings. The lens 18 further comprises protrusions 32, which may be lens feet, that allow the LED package 10 to be removeably secured in a coupling device 36 of the mounting device 54 in a socket like fashion, where the feet 32 are biased against the coupling device 36 via flexible extensions 34 extending from a peripheral portion of the anode 12. Alternatively, as seen in FIGS. 9–10, the socket device may be incorporated directly in a light fixture to eliminate the need for secondary coupling devices and printed circuit boards. After being removeably secured in the mounting device 54, extensions 55 extending from the mounting device 54 are received in openings 56 in a printed circuit board (PCB) 40 and extension 57 extending from the mounting device 54 is received in opening 58 in the PCB 40 to couple the mounting device 54 to the PCB 40. Within the mounting device 54, an opening 59 receives the cathode post 60.

Figure 1A:
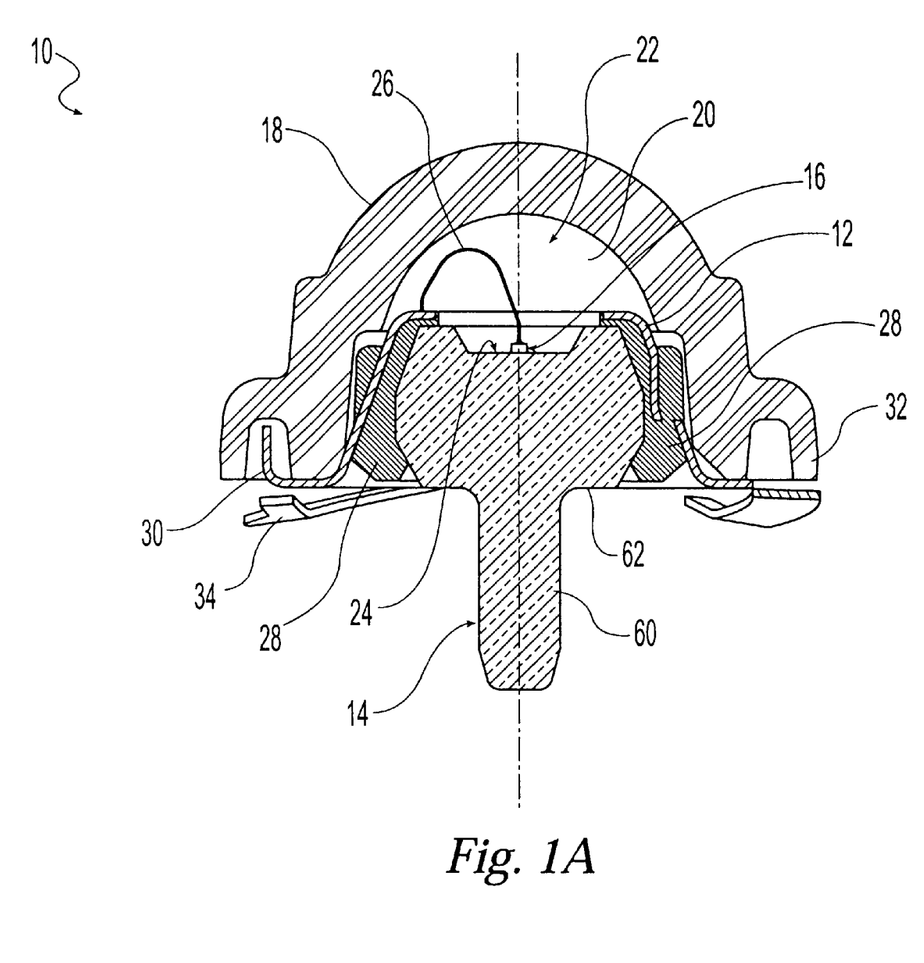
FIG. 1A is a cross sectional view of one embodiment of a LED package.
Figure 1B:
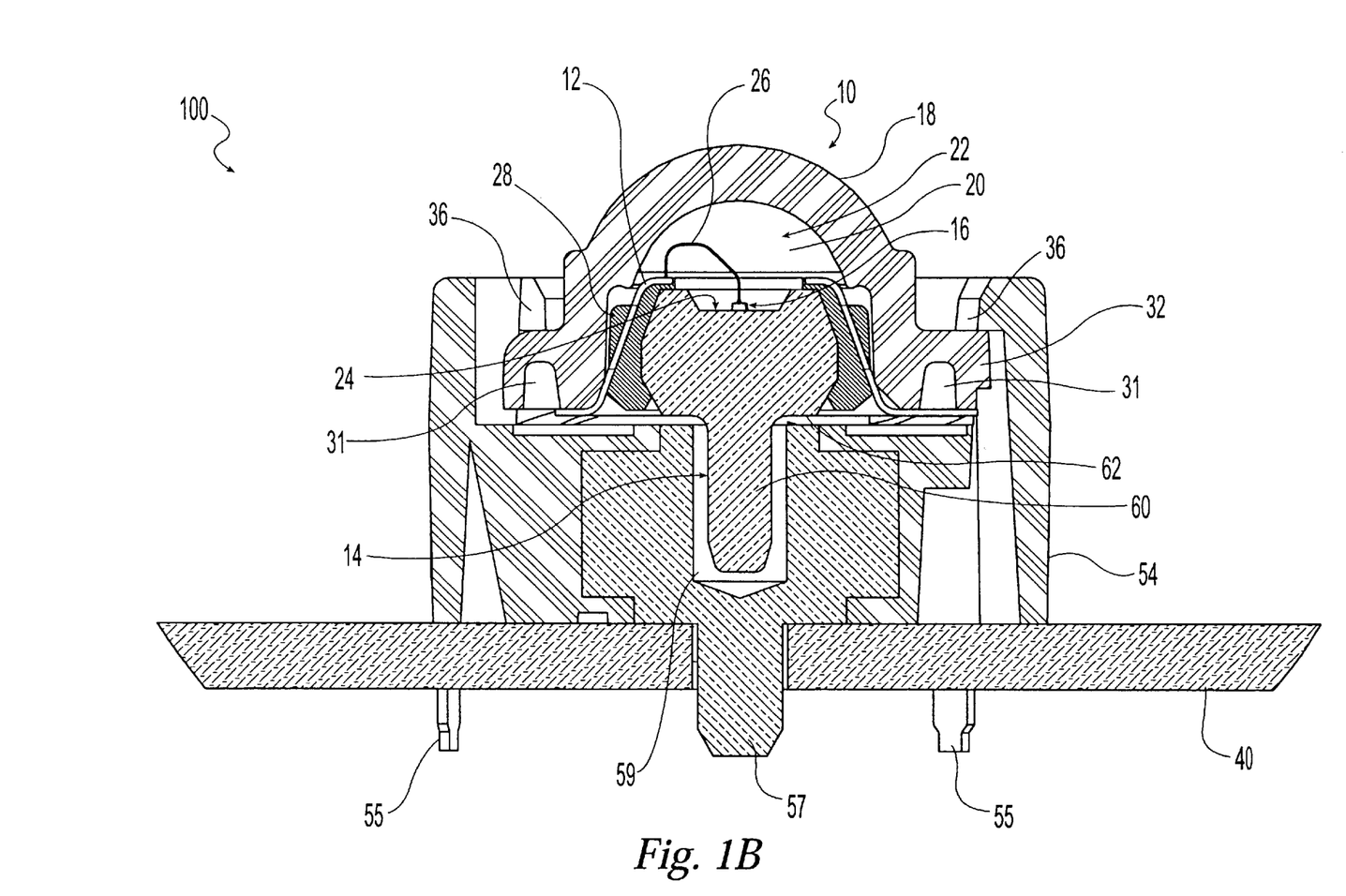
FIG. 1B is a cross sectional view of one embodiment of a system.
Figure 2:
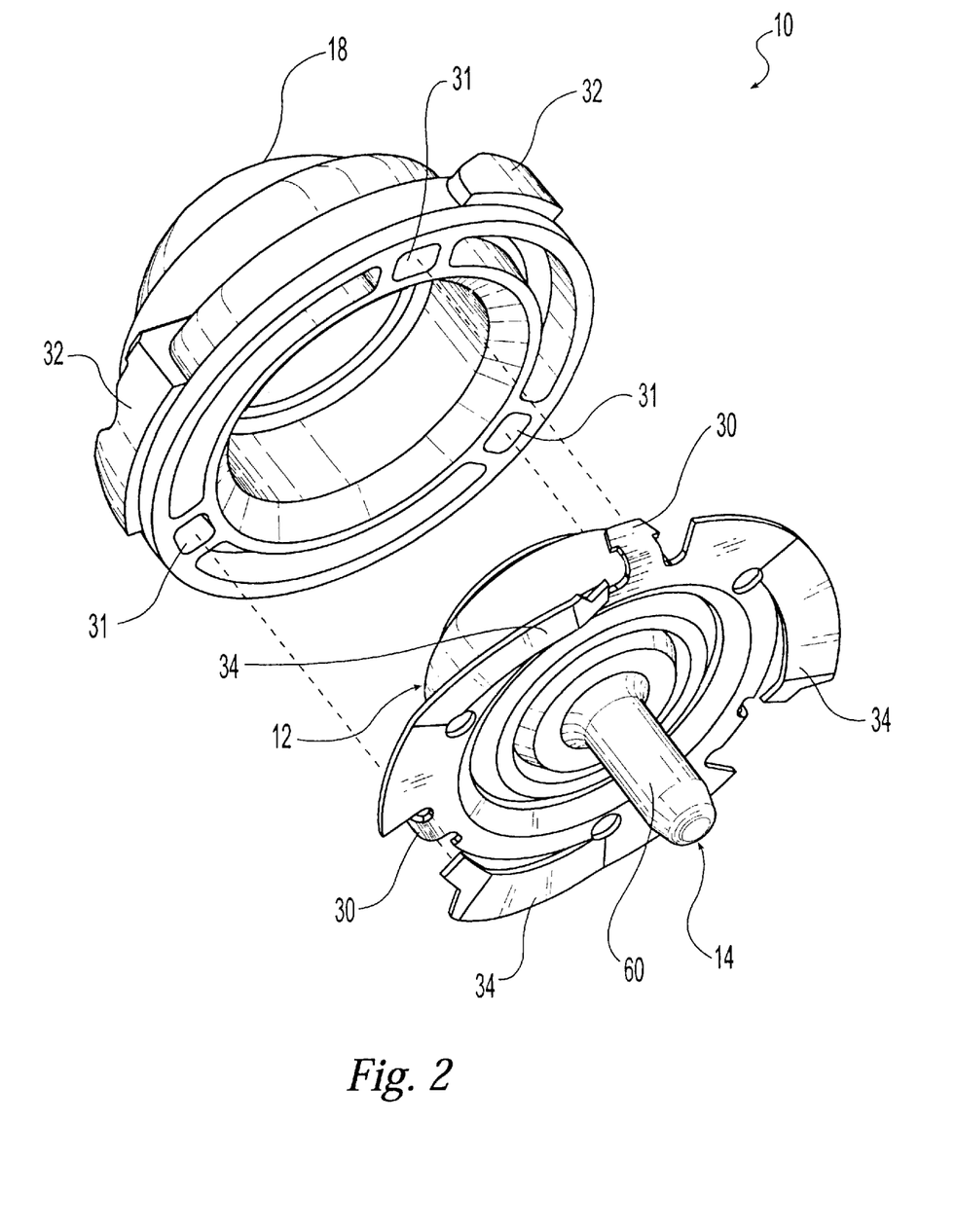
FIG. 2 is an exploded view of one embodiment of an LED package.
Figure 3:
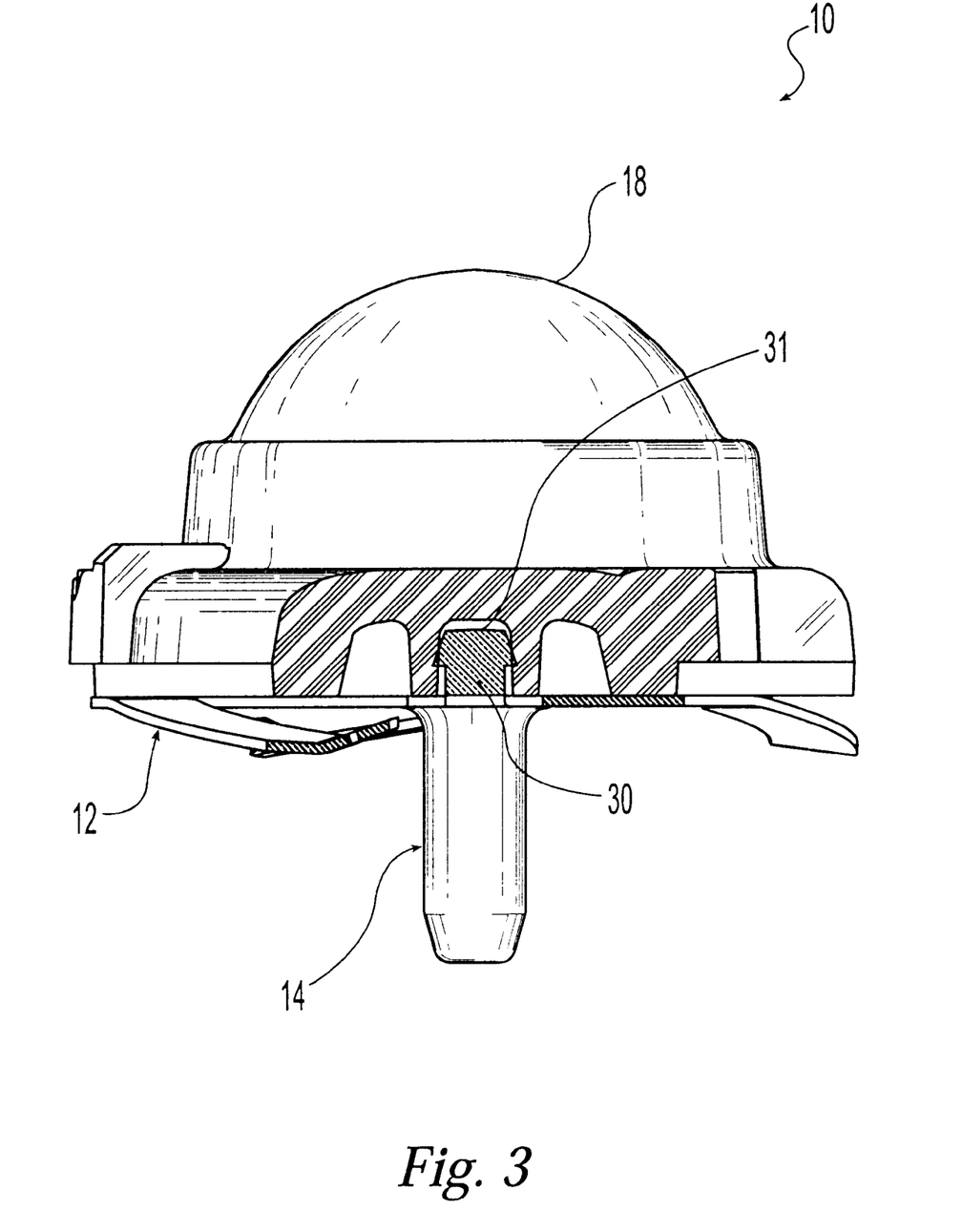
FIG. 3 is a partial cross section view of a section of one embodiment of an LED package.
Figure 4:
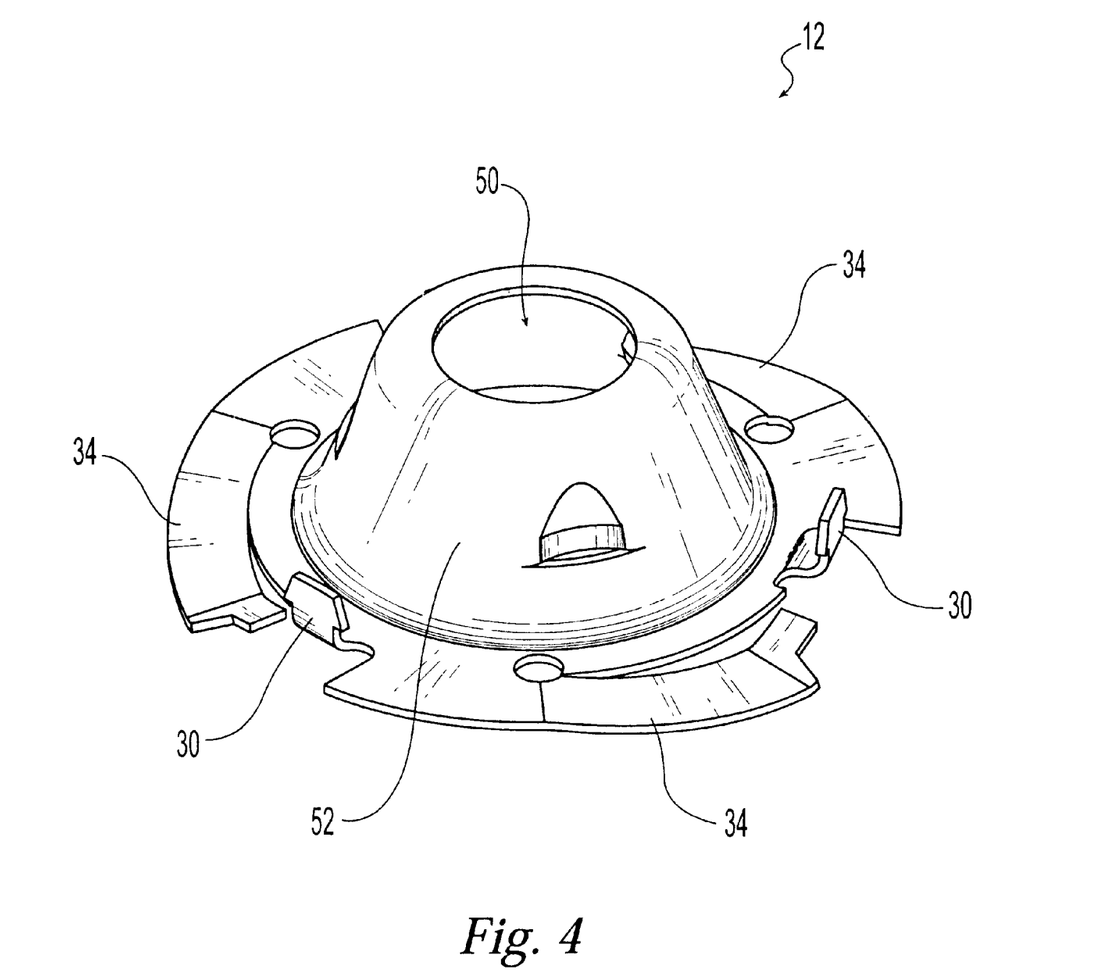
FIG. 4 is a perspective view of an anode according to several embodiments.
Figure 5:
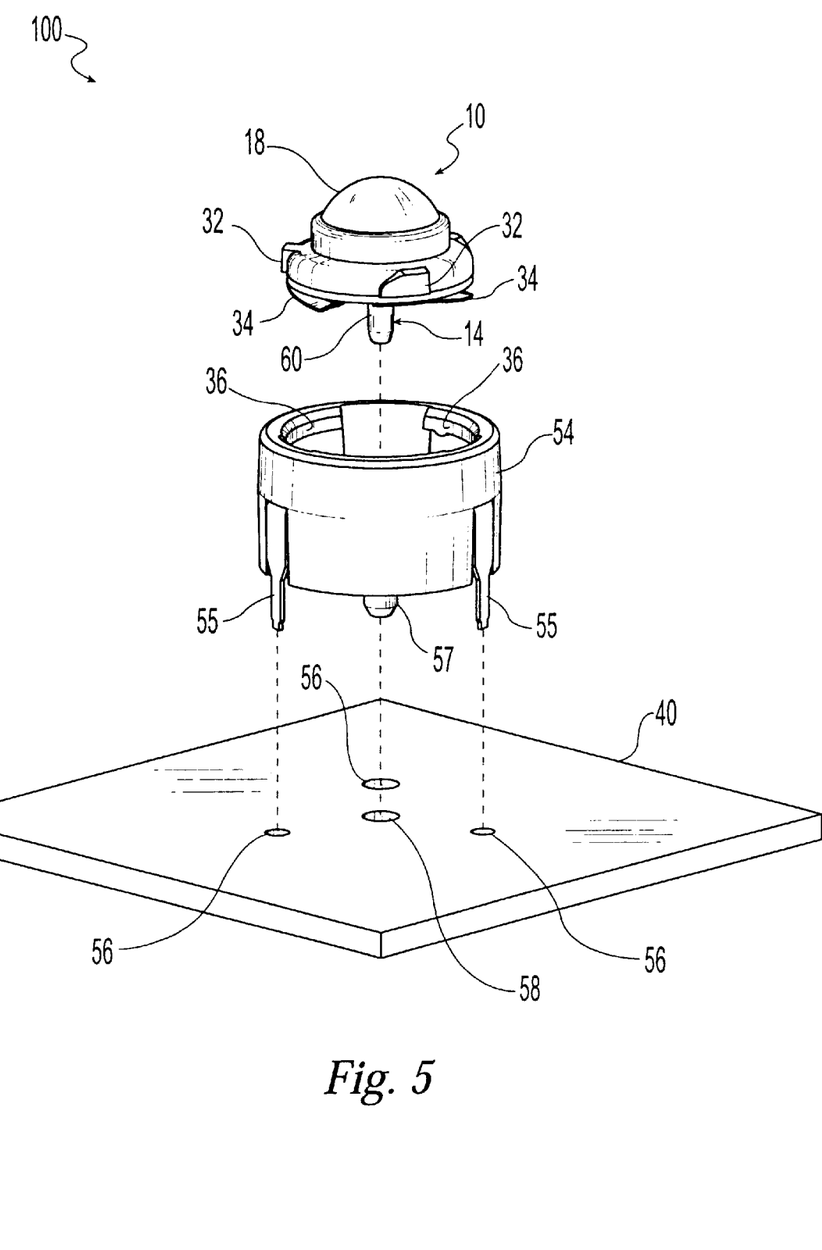
FIG. 5 is an illustration of another embodiment of a system comprising a printed circuit board and an LED package.

The annular anode 12 is central to the system 100. The annular anode 12 is a lead frame for the LED system 100. As best seen in FIG. 4, in the circular embodiment shown, the annular lead frame 12 somewhat resembles an inverted pie pan having a centralized, preferably concentric window 50 formed in the "bottom" 52 providing access to the LED die 16 and wire bonding 26, and through which light emitted from the LED die 16 is distributed to the lens 18. However, other embodiments contemplate other generally symmetrical shapes, which are equally well suited as lead frames, as is the annular embodiment. As discussed above, in an embodiment the stamped barbs 30 are formed about the periphery of a body of the lead frame 12 for captive engagement between the lead frame 12 and the receiving openings 31 of the lens 18 during assembly of the LED package 10.

Figure 11:
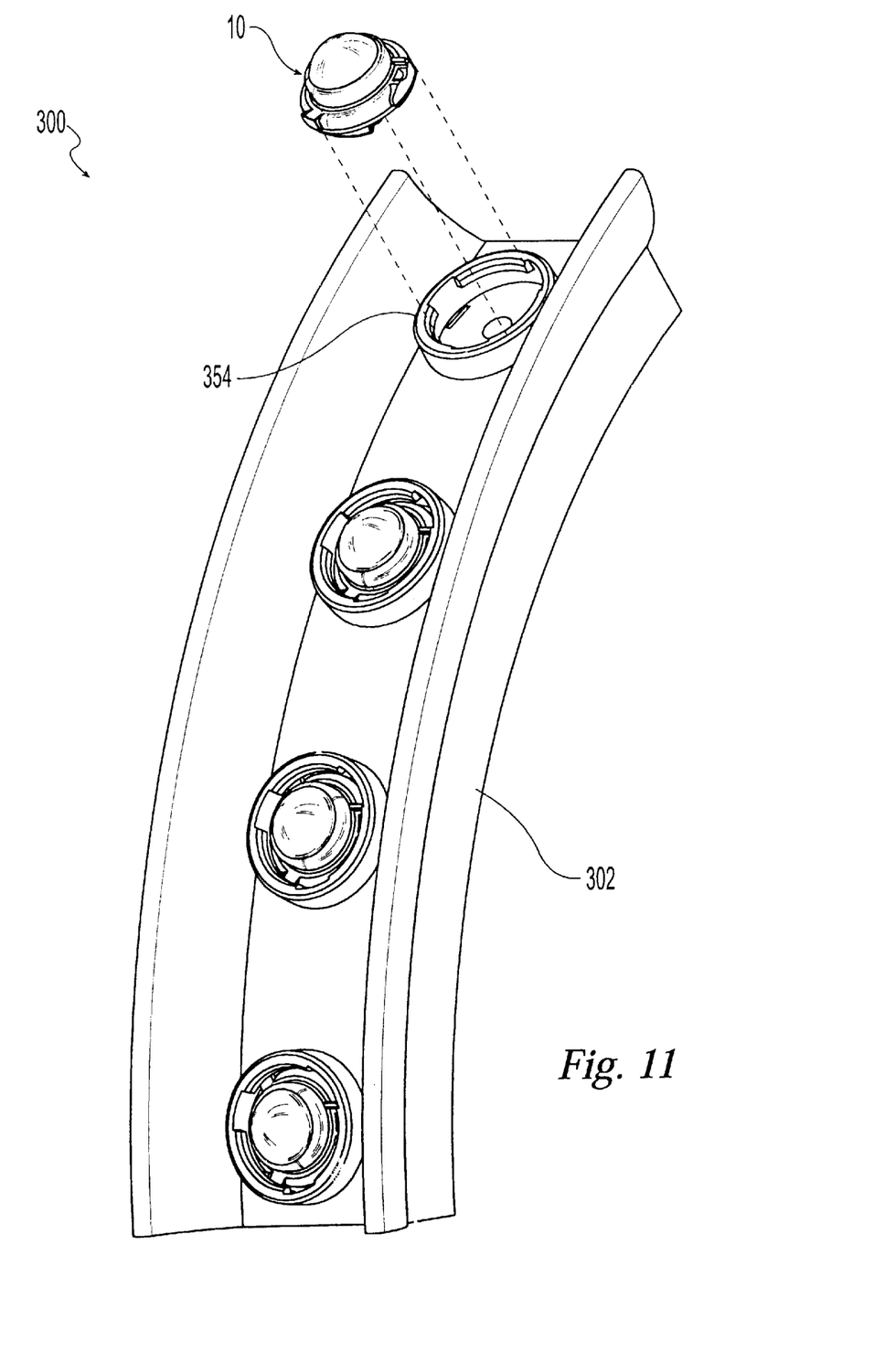
FIG. 11 is an illustration of another embodiment of the system comprising a carrier array and LED packages.

The LED package 10 also allows for significant improvement in the product assembly process. Since the circular LED package 10 is not orientation-specific, it may be mounted in the mounting device 54 on the PCB 40, or as seen in FIG. 10 the LED package 10 may be mounted in mounting device 254 in a light illumination device 200, or as seen in FIG. 11 the LED package 10 may be mounted in a mounting device 354 in an light fixture assembly 300, where in any of these embodiments the LED package 10 is mounted in any orientation, radially about its center. This eliminates the need for specific component orientation prior to assembly. The embodiment shown in FIGS. 1–5 may resemble an RCA-type plug that allows the LED package 10 to be easily installed into the coupling device 36 in the mounting device 54 in a socket like fashion without the need for heat or any specialized tools.

The annular form of the lead frame 12 is further designed to provide a large surface area for sinking heat generated during use. The shape has the still further benefit of reducing thermal expansion due to hoop stresses inherent with the annular geometry.

Figure 7:
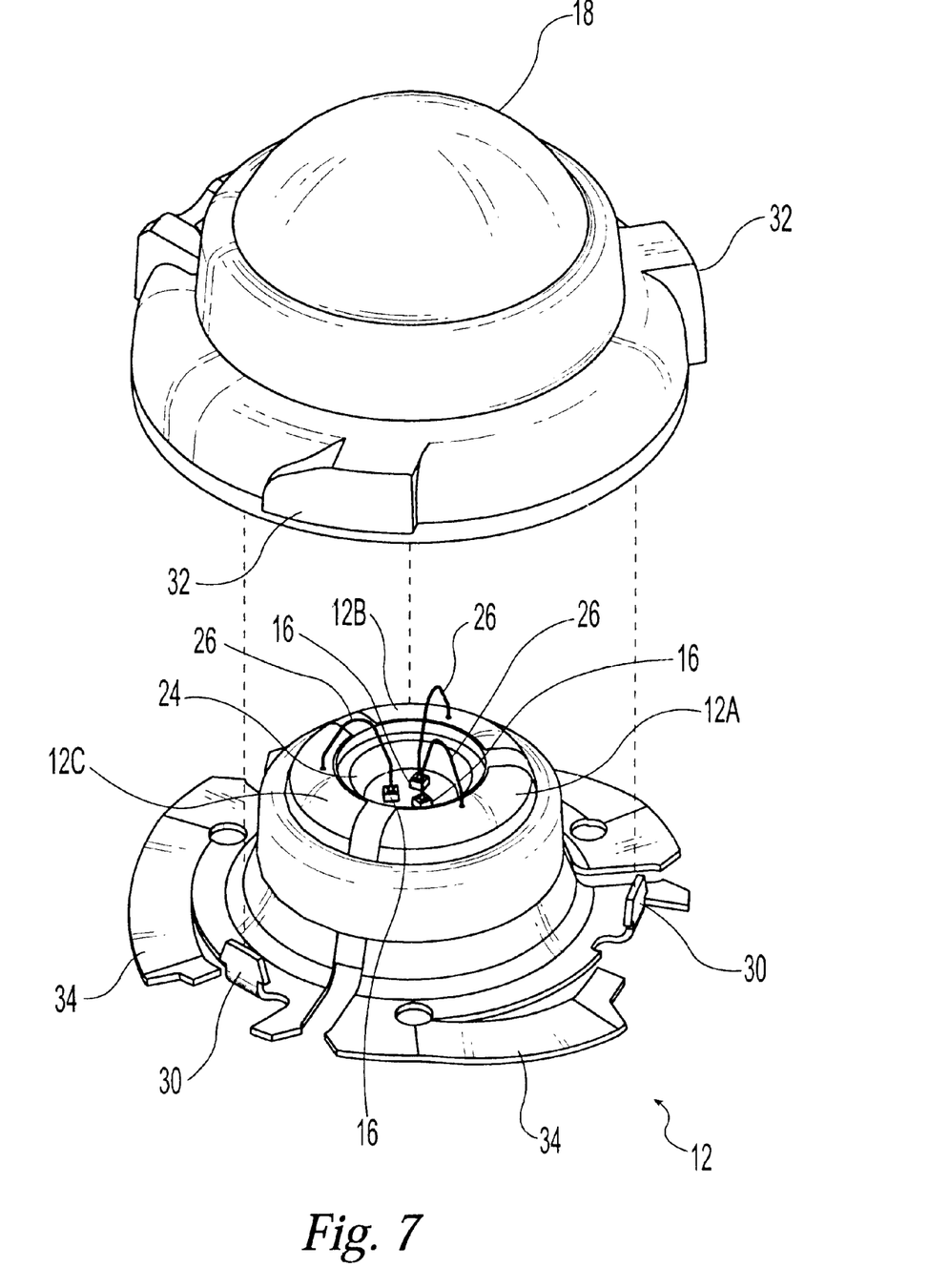
FIG. 7 is an exploded view of another embodiment of an LED package with plural LED dies.

Other embodiments of the LED package 10 utilize multiple LED dies 16, such as the embodiment shown in FIG. 7, which may include a red, green, and blue LED die 16. In some of these embodiments, each of the LED dies 16 must be coupled via the wire bonding 26 to different segments of the lead frame 12 to provide a separate anode segment 12A–C for each LED die 16. With the annular configuration of the embodiments, multiple wire bonding 26 from the lead frame 12 to the multiple LED dies 16 can be easily accommodated.

Finally, the lead frame 12 may be laser welded, rather than soldered, or otherwise mechanically coupled to the PCB 40 to provide electrical contact between the LED package 10 and the PCB 40, thereby minimizing the risk of overheating the LED die 16 during assembly of the LED package 10 into a product or subassembly.

The LED package 10 utilizes a lens 18, which may be premolded and may be constructed of any one of a number of known materials, which may be epoxy resin, urea resin, silicon resin, acrylic resin, glass, or the like, in various lens patterns or geometries. While shown in a circular embodiment, the shape of the lens 18 may be any generally symmetrical shape such as, without limitation, square, hexagonal, triangular and the like. The lens 18 provides the optical pattern for the LED package 10, and may be configured as a convex, concave, or collimating lens and may be optically clear or contain dispersants to diffuse the outputted light. In several embodiments, the inside surface of the lens 18 may be coated with a suitable light excitable material or the lens 18 may comprise a suitable light excitable material, which may be a phosphor material, for generating white light when excited with a blue, ultraviolet, or other color LED die 16. In other embodiments, the silicone or viscous material 20 may comprise the light excitable material. In addition, the lens 18 both partially defines the cavity 22 for the viscous material 20 and acts as a protective shield for the LED die 16 and attendant wire bonding 26. By premolding the lens 18, the optical output of the LED package 10 is easily modified by producing a different configuration, pattern, or geometry of the lens 18.

The viscous material 20 may be an optical quality gel or grease or other viscous material, which may have a refractive index of n≈1.70 or greater. The viscous material 20 is contained in the lens 18 to possibly provide gradual transition of index of refraction between the LED die 16, which may have an index of refraction about n≈3.40, and the lens 18, which may be have an index of refraction of about n≈1.5. If the viscous material 20 is an optical gel it may be of the type manufactured by Nye Optical. In addition, the viscous material 20 reduces the stress on the wire bond 26 and LED die 16 caused by thermal expansion. In one embodiment, the viscous material 20 is formed so that it has varying indexes of refraction by arranging it in layers within the lens 18, where the layer having the highest index of refraction is closest to the LED die 16. In addition to facilitating assembly of the LED package 10, the varying layers of viscous material 20 between the LED die 16 and the lens 18 also lessens the Fresnel losses within the LED package 10.

As previously discussed, in some embodiments a white emitted or output light is produced using a blue, ultraviolet, or other color LED die 16 by exciting light excitable materials, which may be fluorescent materials, that may be located in or on the lens 18, or similar to what is disclosed in Shimizu et al. in U.S. Pat. Nos. 5,998,925 and 6,069,440, the viscous material 20 may contain a suitable phosphor material. However, unlike the Shimizu et al. patents, in some embodiments one or more layers of the viscous material 20 replaces the prior art cured epoxy coating resin. In addition, in other embodiments, rather than being confined to the cavity 22 holding the LED die 16, the phosphor bearing viscous material 20 fills the cavity 22 of the entire lens 18, which is more effective for converting more of the excitation output into white light. In the circular embodiment shown in the figures, the semispherical configuration of the phosphor bearing viscous material 20 also provides more of an omnidirectional output than the LEDs generally depicted by Shimizu et al.

The wire bonding 26 used to connect the lead frame 12 to the LED die 16 may be gold, but may also be made from copper, platinum, aluminum or alloys thereof. The diameter of the wire bonding 26 is typically in the area from 10–45 µm. As recognized in the art, because of thermal expansion coefficients between materials in LEDs made according to the prior art methods, wire bonds with diameters less than 25 µm are not recommended because of breakage at the bonding point. Accordingly, unlike the prior art, the wire bonding 26 is encapsulated in a viscous material rather than a hard resin, thus permitting some expansion without loss of the electrical bonding. The wire bonding 26 is connected to the electrode(s) of the LED dies(s) 16 and the lead frame 12 by normal wire bonding techniques.

The cathode 14, which may be a copper slug or heat sink, is provided at the center of the LED package 10, and serves as the cathode for the LED package 10. As discussed above, the cathode 14 is configured to have the die cup 24 at its uppermost surface, within which the LED die 16 is mounted. As also discussed above, the liquid crystal polymer 28 may be used to couple the cathode 14 into place within the anode 12. The liquid crystal polymer 28 also provides a barrier to seal the viscous material 20 in place. In addition, because the liquid crystal polymer 28 is thermally coupled to the anode 12 it provides for additional heat sinking for the LED die 16. The inner surface of the die cup 24 may be finished with a reflective surface, via plating or other means, in order to direct the light emitted from the LED die 16 in a predetermined manner. The mass of the cathode 14 provides superior heat sinking for the LED die 16 to allow higher power to be applied to the LED die 16, resulting in higher lumen output.

Figure 6:
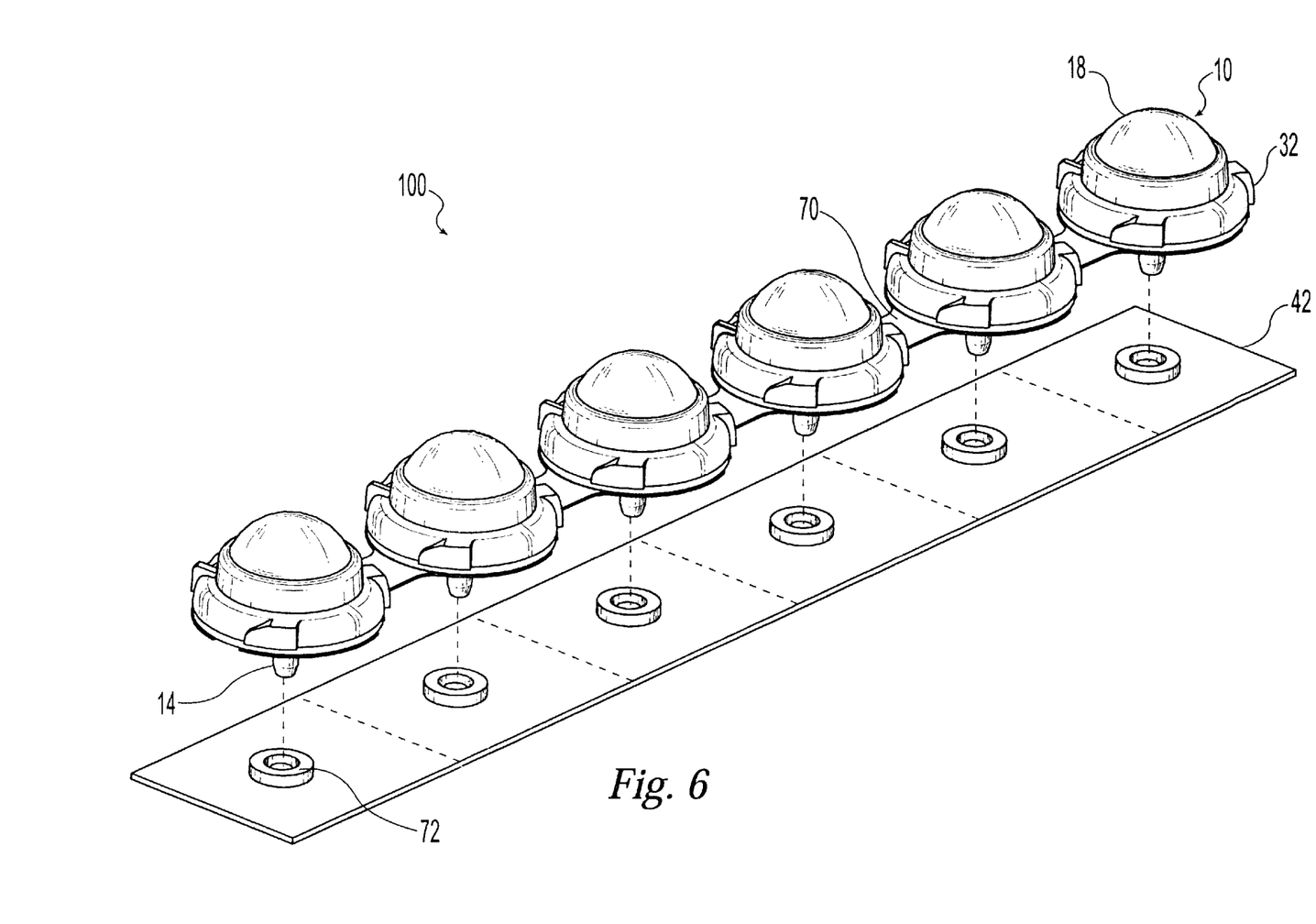
FIG. 6 is an illustration of another embodiment of a system comprising a carrier strip and LED packages.
Figure 8A:
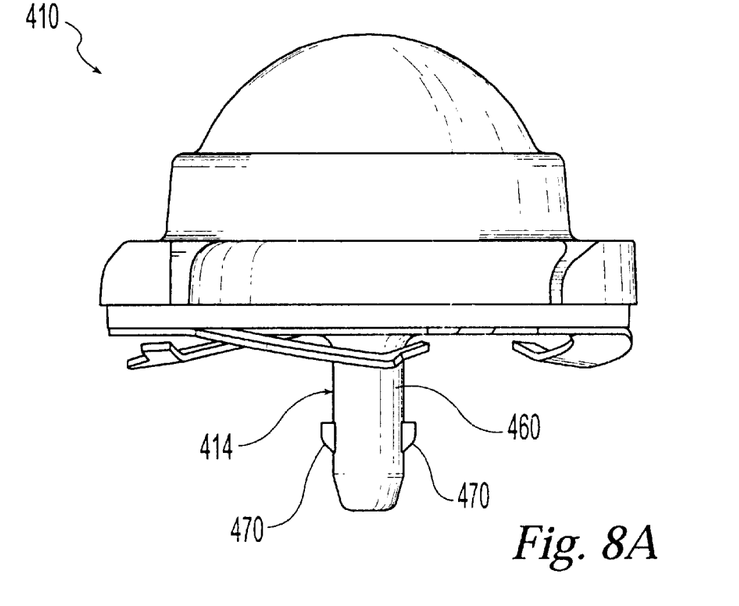
FIG. 8A is a side view of another embodiment of an LED package.
Figure 8B:
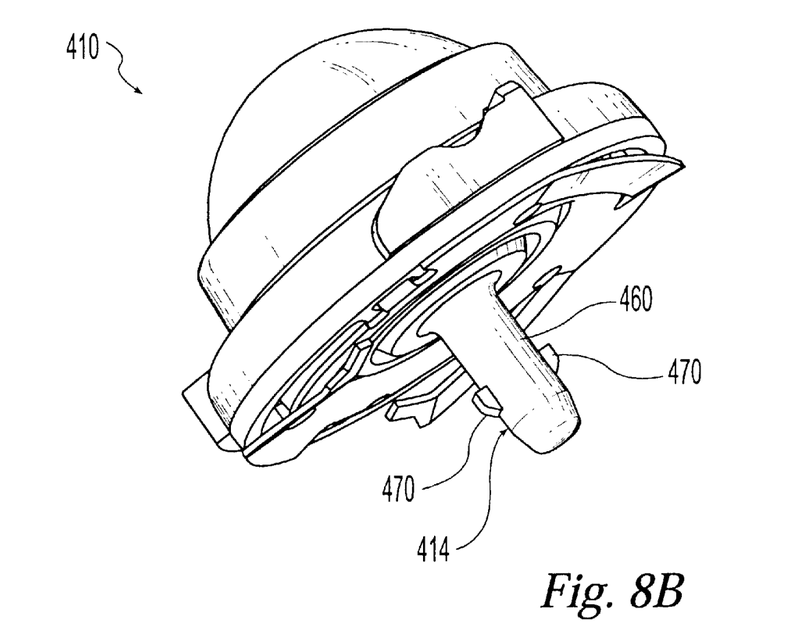
FIG. 8B is a bottom view of the LED package of FIG. 8A.

In some embodiments, the cathode 14 may be provided with an integral center post 60. When so configured, the LED package 10 can be assembled into a PCB 40 assembly by normal soldering techniques or, without the use of heat, by press fitting the LED package 10 into a complementary socket arrangement of mounting devices 32 and 36. In other embodiments, a base 62 of the cathode 14, when there is no integral center post, can be laser welded or otherwise mechanically coupled to the anode 12 to provide electrical contact. In other embodiments, as seen in FIG. 6, each of the cathodes 14 of each of the LED packages 10 may be connected to receiving devices 72 on a carrier strip 42, where each of the anodes 12 may be connected using an carrier strip 70. In other embodiments, as seen in FIGS. 8A–B, an LED package 410 comprises a cathode 414 with a post 460 that comprises protrusions 470 that may be coupled to a complementary coupling device in the system, which may a bayonet type coupling system. In other embodiments, as seen in FIGS. 9A–B, an LED package 510 comprises a cathode 514 with a post 560 having a threaded outer surface 570, which may be coupled to a complementary coupling device in the system.

The LED die 16, which may have an index of refraction of n≈3.40, provides lumen output. The LED die 16 design and its method of manufacture are described in by Shimizu and others. The LED die 16 may be a multi-layer epitaxial semiconductor structure whose anode and cathode are electrically mounted to an inner lead 12 and mount lead 14, respectively. When energized, the LED die 16 is the component that emits light of a wavelength predetermined by its chemical makeup. As discussed above, to produce the desirable white LED output, multiple colors of LED dies 16, such as red, blue, and green, may be combined into a single LED package, as seen in FIG. 7. However, in other embodiments a blue, ultraviolet, or other color LED die 16 is used to excite a phosphor containing component in the lens 18 or silicone or viscous material 22 in order to produce a white light. Some prior art devices that have similar functions are Singer et al. that teaches the use of a phosphor layer on top of a blue LED chip to produce a white LED, Shimizu et al. that teaches the use of phosphor materials embedded into a resin coating material place over the LED chip, and Shimizu et al. that teaches the use of phosphor materials in the molded lens surrounding the LED chip.

As seen in FIG. 6, one embodiment provides an array of the anodes 12 that is formed continuously into the carrier strip 70, which may be an anode carrier strip, maybe by stamping or other conventional means. This configuration facilitates manufacturing of the LED package 10. The anode carrier strip 70 also provides for alternate means of packaging the LED package 10 into subassemblies. For example, the carrier strip 42, which may be a cathode carrier strip, containing receiving devices 72 having a common cathode may be employed as one assembly. In such an application, only one electrical connection to the cathode would be necessary. Likewise, the anode carrier strip 70 can be configured to have a common anode, in which case an entire strip of the LED packages 10 can be easily assembled into a product by making only two electrical connections. The cathode carrier strip 42 and the anode carrier strip 70 may be periodically scored (shown as dashed lines) along their length to enable the cathode carrier strip 42 and the anode carrier strip 70 to be in broken into predetermined lengths.

The various embodiments have been described in detail with respect to specific embodiments thereof, but it will be apparent that numerous variations and modifications are possible without departing from the spirit and scope of the embodiments as defined by the following claims.

What is claimed is:

1. A system comprising an LED package, the LED package comprising:
   an annular anode;
   a cathode coupled to the annular anode;
   an LED die coupled to the cathode and the annular anode;
   a lens coupled to the annular anode; and
   a viscous material located in a cavity defined by the lens, the cathode, and the annular anode.

2. The system of claim 1 further comprising a mounting device, wherein the LED package is mechanically coupled to the mounting device via the lens.

3. The system of claim 1, further comprising a light fixture.

4. The system of claim 1 further comprising:
   an anode strip comprising an array of anodes utilized to form an array of the LED packages; and
   a carrier strip comprising receiving devices to receive the array of LED packages.

5. The system of claim 1 wherein the annular anode and the lens comprise complementary coupling devices for matingly engaging said annular anode and lens to one another.

6. The system of claim 5 wherein the complementary coupling devices are annular anode barbs and lens openings.

7. The system of claim 1 wherein the LED die is comprised of a plurality of LED dies.

8. The system of claim 1 wherein the LED die is coupled to the cathode via a thermally and electrically conductive epoxy and the LED die is coupled to the annular anode via wire bonding.

9. The system of claim 1 wherein the cathode is a heat sink.

10. The system of claim 1 wherein the cathode comprises a die cup into which the LED die is coupled.

11. The system of claim 1 wherein the annular anode is a lead frame.

12. The system of claim 1 wherein a portion of the lens comprises light excitable material such that the system emits white light.

13. The system of claim 1 wherein a portion of the lens comprises dispersants to diffuse output light.

14. The system of claim 1 wherein the viscous material is a non-resilient material.

15. The system of claim 1 wherein the viscous material is a grease.

16. The system of claim 1 wherein the viscous material is a non-liquid material.

17. The system of claim 1 wherein the viscous material is a silicone material.

18. The system of claim 1 wherein a portion of the lens is coated with light excitable material such that the system emits white light.

19. The system of claim 1 wherein the system is incorporated into a taillight device.

20. The system of claim 1 wherein the system is incorporated into a flashlight device.

21. The system of claim 1 further comprising a socket device that is mounted on a board, wherein the lens is mechanically coupled to the socket device via lens protrusions and securely biased in the socket device by flexible extensions extending from the annular anode.

22. The system of claim 1 wherein the cathode comprises a threaded portion, wherein the threaded portion is used to couple the LED package to the system.

23. The system of claim 1 wherein the viscous material comprises a light excitable material.

24. The system of claim 23 where a white light is produce by the light excitable material.

25. The system of claim 1 further comprising:
   a mounting device; and
   protrusions adjacent an attachment end of the cathode, wherein the LED package is mechanically mounted to the mounting device via the protrusions.

26. The system of claim 1 wherein the lens comprises an optical geometry to diffuse illumination from the LED die.

27. The system of claim 1 wherein the lens comprises an optical pattern to diffuse illumination from the LED die.

28. The system of claim 1 wherein the lens comprises an optical geometry to produce a desired light pattern.

29. The system of claim 1 wherein the lens comprises an optical pattern to produce a desired light pattern.

30. A system comprising:
   a mounting device; and
   an LED package, the LED package comprising:
      an annular lead frame with a central opening;
      a heat sink coupled to the lead frame adjacent the central opening;
      an LED die coupled to the heat sink and via wire bonding to the lead frame;
      a lens coupled to the lead frame, the lens comprising protrusions that are utilized to mechanically secure the LED package to the mounting device;
      silicone material located in a cavity defined by the lens, the heat sink, and the lead frame.

31. The system of claim 30 wherein the silicone material is a gel.

32. The system of claim 30 wherein the silicone material is viscous.

33. The system of claim 30 wherein the silicone material is a grease.

34. A system comprising an LED package, the LED package comprising:
   an annular anode;
   a cathode coupled to the annular anode;
   an LED die coupled to the cathode and the annular anode;
   a lens coupled to the annular anode; and
   a cavity defined by the lens, the cathode, and the annular anode.

35. The system of claim 34 further comprising a material in the cavity.

36. The system of claim 35 wherein the material is a viscous material.

37. A system comprising an LED package, the LED package comprising:
   an annular anode;
   a cathode coupled to the anode;
   an LED die coupled to the cathode and the anode;
   a lens coupled to the anode; and
   a viscous material located in a cavity defined by the lens, the cathode, and the anode.

38. The system of claim 1 wherein the cavity is filled with the viscous material.

* * * * *